United States Patent [19]

Ostrogorsky

[11] Patent Number: 5,047,113
[45] Date of Patent: Sep. 10, 1991

[54] METHOD FOR DIRECTIONAL SOLIDIFICATION OF SINGLE CRYSTALS

[76] Inventor: Aleksandar Ostrogorsky, 560 Riverside Dr., Apt. #16C, New York, N.Y. 10027

[21] Appl. No.: 397,741

[22] Filed: Aug. 23, 1989

[51] Int. Cl.$^5$ .............................................. C30B 11/02
[52] U.S. Cl. ............................ 156/616.1; 156/616.2; 156/616.3; 156/616.4; 156/616.41; 373/116
[58] Field of Search ............... 156/616.1, 616.2, 616.3, 156/616.4, 616.41, DIG. 70; 422/248; 373/116

[56] References Cited

U.S. PATENT DOCUMENTS

| | | | |
|---|---|---|---|
| 2,936,505 | 5/1960 | Witucki et al. | 373/116 |
| 3,591,340 | 7/1971 | Plaskett | 156/616.2 |
| 3,898,051 | 8/1975 | Schmid | 156/616.41 |
| 4,404,172 | 9/1983 | Gault | 156/616.3 |
| 4,687,538 | 8/1987 | Pastor | 156/616.4 |

FOREIGN PATENT DOCUMENTS

| | | | |
|---|---|---|---|
| 1197755 | 12/1985 | Canada | 156/616.2 |
| 3441707 | 11/1984 | Fed. Rep. of Germany | 156/616.1 |
| 2213403 | 8/1989 | United Kingdom | 156/616.4 |

OTHER PUBLICATIONS

Tyutyunnik et al., "LiH Crystal Growth by Bridgman-Stockbarger Method", Journal of Crystal Growth, vol. 68, No. 3, Oct. 1984, p. 743.
"A Novel Application of the Vertical Gradient Freeze Method to the Growth of High Quality III-V Crystals", W. A. Gault et al., Journal of Crystal Growth 74 491–506 (1986).
Muller, Crystals, Springer-Verlag, New York, pp. 58-59, 131 (1988).

*Primary Examiner*—Robert Kunemund
*Attorney, Agent, or Firm*—Choate, Hall & Stewart

[57] ABSTRACT

The invention provides a method for growth of single crystals from the melt by directional solidification in vertical bottom seeded crucibles. The crucible confining the melt is insulated radially and from above. The heat is supplied to the melt by a heater submerged in the melt or an auxiliary heater above the crucible containing the melt. A small portion of the melt is enclosed between the submerged heater and the growing crystal. The confined melt in this region is thermally stratified and therefore stagnant.

38 Claims, 2 Drawing Sheets

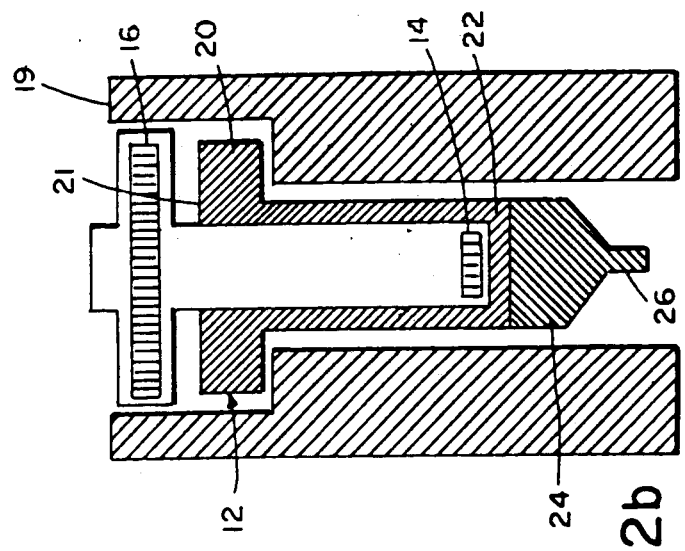
FIG. 2a
FIG. 2b
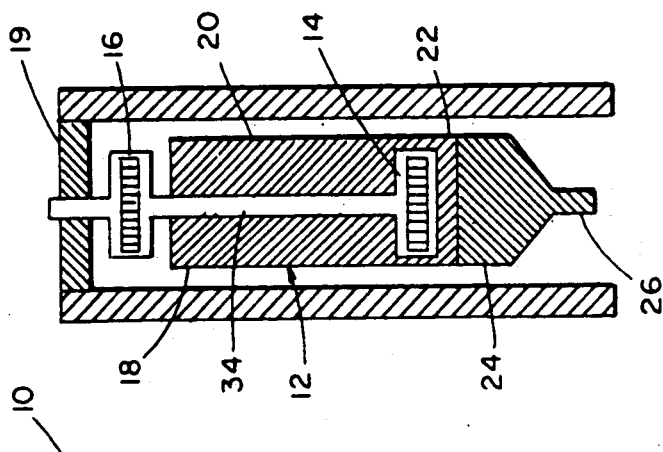
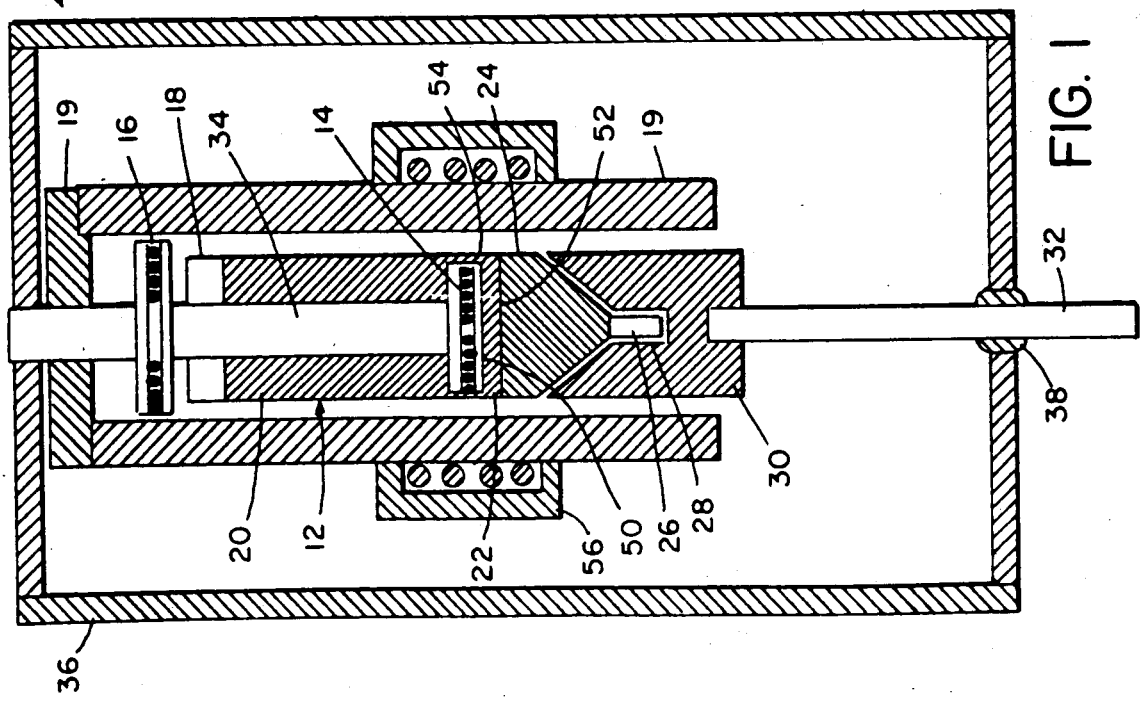
FIG. 1

METHOD FOR DIRECTIONAL SOLIDIFICATION OF SINGLE CRYSTALS

BACKGROUND OF THE INVENTION

The invention relates to the directional solidification of single crystals in vertical bottom seeded crucibles.

The growth of single crystals by directional solidification in vertical bottom seeded crucibles is well established in the art and is referred to as the vertical Bridgman method (Muller, Crystals, Springer-Verlag, New York (1988)).

According to the vertical Bridgman method, crystal growth is accomplished by movement of the crucible or other melt container or by movement of the heat source to create a temperature gradient which results in solidification of the melt. In a variation of a vertical Bridgman method, the vertical gradient freeze method, both the melt container and heater are stationary and heat input is reduced electronically to establish a temperature gradient.

Both the vertical Bridgman method and vertical gradient freeze methods are performed inside tube type furnaces where the melt is heated radially, through the crucible walls, resulting in radial temperature gradients in the growing crystal and the melt. The radial temperature gradients result in unsteady, natural convection in the melt and a curved i.e. non-planar liquid-solid interface. The unsteady convection produces striations i.e. microscopic inhomogeneities, in the grown crystal and convective mixing promotes longitudinal and radial macrosegregation. Furthermore, radial temperature gradients induce thermal stresses and dislocations in the grown crystal. The production of these inhomogeneities and defects compromises the crystalline and chemical perfection of the growing crystal.

Multi-segment tube type furnaces have been constructed to avoid these problems. Such furnaces have been utilized in the successful growth of III-V compounds.

SUMMARY OF THE INVENTION

According to one aspect of the invention, a method for crystal growth by directional solidification is provided. According to this method, a melt is heated with an axial heat flow source and this heat flow source is displaced with respect to the melt to initiate crystal growth.

In another aspect of the invention, a method for crystal growth for directional solidification is provided which consists of supplying a melt having the chemical composition of the desired crystal in a crucible and heating the melt axially using a first heater submerged in this melt and a second heater above the crucible. The first heater is kept in close proximity to the single crystal being grown and has a diameter nearly equal to the crucible diameter. Crystal growth is initiated using a seed and proceeds as the heat source is displaced relative to the single crystal being grown. Heat is removed via a heat sink. All elements of the apparatus may be contained within a tank which provides a controlled atmosphere for the crystal growth.

Other preferred embodiments provide for enclosure of the heaters in inert jackets, use of cylindrical plate heat diffusers with the second submerged heater and rotation of these plates to further enhance heat flow uniformity.

The method of the invention offers all the advantages inherent in conventional vertical Bridgman methods as appreciated by those skilled in the art of crystal growth. In addition, use of the submerged heater results in radial temperature gradients in the melt and crystal which are orders of magnitude lower than those encountered in conventional vertical Bridgman methods utilizing tube-type heaters. Reduction in radial temperature gradients limits or greatly improves microsegregation (striations), longitudinal macrosegregation, radial macrosegregation, and thermal stresses which give rise to dislocations. Furthermore, during the growth process, the growth interface remains planar and the confined melt, between the submerged heater and the crystal, retains a constant height and volume throughout the growth process. According to the method of the invention, most heat is dissipated through the growing crystal, reducing the power requirements by comparison with those of vertical Bridgman and Czochralski methods, making the apparatus, including its power supply, cooling system and heater design, simple and inexpensive.

BRIEF DESCRIPTION OF THE DRAWING

In the drawing:

FIG. 1 is a schematic illustration of an apparatus for growth of single crystals;

FIGS. 2a and 2b are schematic cross sections of the apparatus of FIG. 1, comparing two different main and auxiliary heater configurations;

DESCRIPTION OF THE PREFERRED EMBODIMENT

Figure 2C:
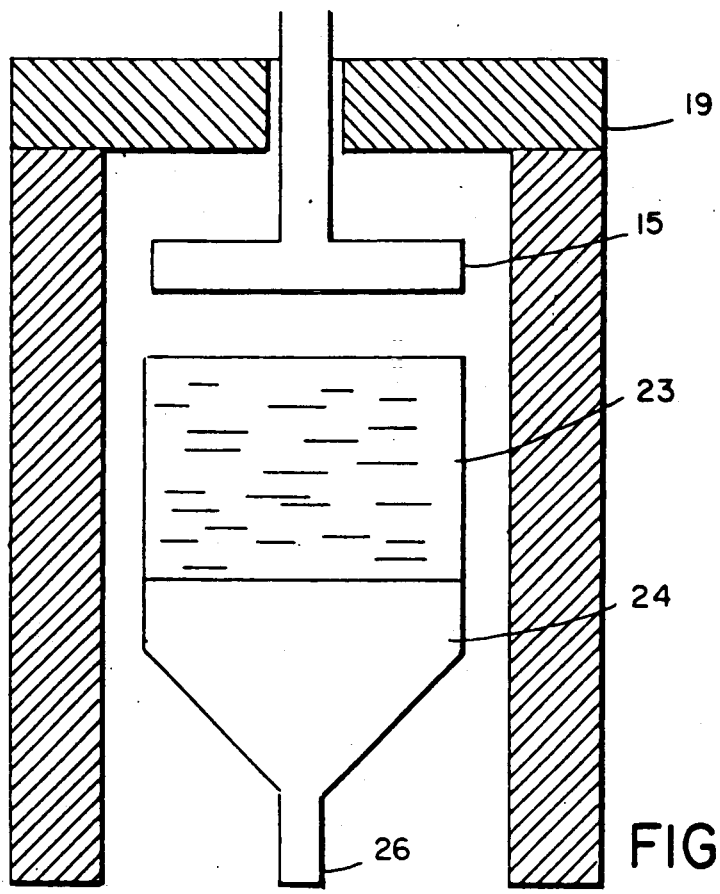
FIG. 2c is a schematic cross section of an apparatus for growth of single crystals having a single exterior axial heat source.

FIG. 1 shows an apparatus 10 for the growth of single crystals. Apparatus 10 is designed to supply heat to a melt 12 in an axial direction which minimizes the undesirable effects of radial temperature gradients. Such axial heat flow is maintained by submerging a main heater 14 in melt 12 and positioning auxiliary heater 16 exterior to crucible 18 surrounded by insulation 19 which contains melt 12. The crucible may be composed of quartz, pyrolytic boron nitride (PNB), graphite, or other inert materials. Submersion of heater 14 in melt 12 divides melt 12 into top melt 20 above heater 14 and confined melt 22 located between heater 14 and growing crystal 24 whose growth is seeded by seed crystal 26 contained within seed well 28 in the tapered bottom of crucible 18. Inert spacer support member 30 acts as a heat sink for extracting heat from growing crystal 24 as auxiliary heater 16 and main heater 14 are displaced relative to growing crystal 24 by pulling shaft 32 which is connected to member 30. This displacement may be accomplished by lowering crucible 18 by pulling on shaft 32 or lifting main heater 14 upward with a mechanism (not shown).

Main heater 14 and auxiliary heater 16 may be protected from contact with melt 12 by enclosing them in inert jacket 34 which may be made from materials such as quartz, pyrolytic boron nitride (PBN), graphite, or other inert material. Jacket 34 may be designed such that its lower portion, containing main heater 40 has a diameter slightly smaller than that of crucible 18 and auxiliary heater 16. Heater 14 and heater 16 may be further protected by maintaining an inert atmosphere within jacket 34. In other embodiments, auxiliary heater 16 may have disc shape, tube shape, similar to heaters used in conventional vertical Bridgman methods, and may be used without jacket 34 and located outside crucible 18.

Apparatus 10 may be enclosed within tank 36 which contains a particular atmosphere i.e. an inert gas, an overpressure of a volatile constituent of growing crystal 24, or vacuum. Tank 36 is water-jacketed and provided with feed-throughs for electrical power, instrumentation and gas and vacuum lines. In a preferred embodiment, tank 36 further includes a viewing window (not shown) and pressure seal 38 for movable shaft 32.

In other embodiments, the free surface of melt 12 may be covered by an inert encapsulant such as $B_2O_3$ which prevents evaporation of volatile components of growing crystal 24 while facilitating its release when the growth process is complete.

In a preferred embodiment, a guarding heater 56, having tube shape, surrounds crucible 18 and insulation 19 at the height of the confined melt 22 region such that a liquid-solid interface between growing crystal 24 and melt 22 is enclosed.

FIG. 2a shows main heater 14 and auxiliary heater 16 configuration wherein both heaters 14 and 16 have the same diameter and inert jacket 34 tapers to enclose heater 14. FIG. 2b shows another embodiment wherein that portion of inert jacket 34 which is submerged within melt 12 has a constant diameter and widens above melt surface 21 to enclose auxiliary heater 16 which has a diameter larger than that of main heater 14. Crucible 18 also widens at its top to accommodate auxiliary heater 16. In another embodiment (FIG. 2c), a single heater 15, which acts as a source of axial heat flow, is positioned above melt 23 and within insulation 19.

Figure 3A:
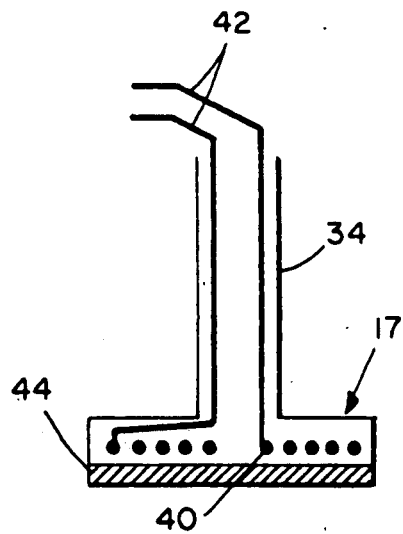
FIG. 3a is a schematic cross section of the main heater of FIG. 1 with a heat diffuser.
Figure 3B:
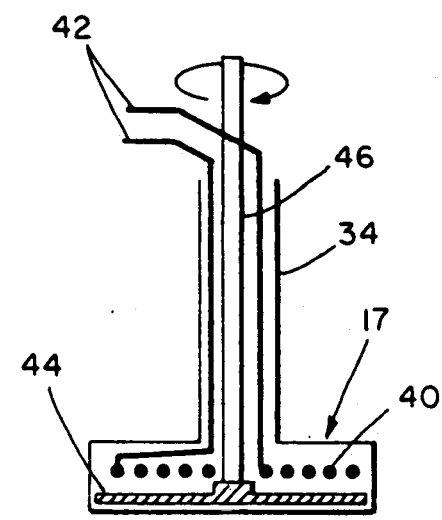
FIG. 3b is a schematic cross section of the main heater of FIG. 1 with a rotatable heat diffuser.

Details of heater construction are shown in FIGS. 3a and 3b. While these figures show a design for main heater 14, this design may be equally well applied to auxiliary heater 16. FIG. 3a shows resistance heater 40 which is preferably composed of a metal, metal alloy, or graphite and designed to provide a uniform radial temperature profile. In other embodiments, multi segment resistance heaters may be employed. Resistance heater 40 and electrical leads 42 for connection to a power supply (not shown) are enclosed within inert jacket 34. Also enclosed within inert jacket 34 is a cylindrical plate heat diffuser 44 composed of a high thermal conductivity material and positioned between resistance heater 40 and melt 12 (FIG. 1) for enhancing heat flux uniformity. FIG. 3b shows a cylindrical plate heat diffuser 44 which may be rotated by shaft 46 for further enhancement of axial heat flux uniformity and symmetry.

Referring to FIG. 1, during crystal growth, the bottom surface 50 of main heater 14 which may be flat or curved to compensate and correct for any curvature in the liquid-solid interface is held at a temperature slightly higher than the melting point of the material to be crystallized, while upper surface 52 of growing crystal 24 is kept at the melting point of the crystal, i.e. 1240° C. for gallium arsenide growth. Since the melt is radially insulated, such a temperature profile provides a strong stabilizing temperature gradient within confined melt 22. Heater 14 temperature is regulated to maintain such a temperature gradient.

The distance between bottom surface 50 and upper surface 52 is typically of the order several mm to several cm; however, this distance, the height of the confined melt 22, may be varied in a synchronous fashion with main heater 14 temperature. If the temperature of main heater 14 is increased, this separation is increased, and if the heater 14 temperature is decreased so is this distance, such that a stabilizing temperature gradient is maintained.

Auxiliary heater 16 is preferably kept at a temperature higher than that of main heater 14 in order to thermally stratify top melt 20. If necessary, auxiliary heater 16 can be used to melt material above main heater 14 to form top melt 20.

Upper surface 52 remains at a constant distance from bottom surface 50 so that the volume of confined melt 22 remains constant. Confined melt 22 remains unaffected by any motion of melt 20 above main heater 14. Consequently, a Raleigh number ($Ra_H$), calculated based on the enclosed melt height, remains constant during the growth, an important advantage over Czochralski and conventional vertical Bridgman methods where melt height continuously changes, enhancing longitudinal segregation.

During the growth process, top melt 20 flows from above heater 14, through annulus 54 between crucible 18 and jacket 34 into confined melt 22.

Flow in the stratified confined melt 22 region is caused by the displacive motion of heater 14 relative to crucible 18. The flow velocities in the confined melt 22 region are of the same order of magnitude as the growth rate, i.e. several $\mu$m/s, guaranteeing that the transport of impurities in the melt is diffusion-controlled and resulting in uniformly doped crystals.

The average flow velocity through annulus 54, $V_A$, is equal to:

$$V_A = \frac{A_{x-s,\ \text{crucible}}}{A_{x-s,\ \text{annulus}}} \cdot V_R$$

where $V_R$ is the displacive velocity of heater 14 relative to crucible 18. By reducing $A_{x-s}$, annulus, $V_A$ can be made large enough to prevent back diffusion of impurities and dopants from confined melt 22 into top melt 20 to yield a uniform axial dopant distribution.

What is claimed is:

1. A method for crystal growth by directional solidification comprising:
   providing a melt having a chemical composition of a desired single crystal in a container;
   heating said material with an axial heat flow source submerged within said melt;
   further providing a heat-sink for removal of heat as said single crystal grows; and
   mechanically displacing said axial heat flow source with respect to said material to cause said crystal to grow.

2. The method of claim 1 further including a heat source disposed exterior to said container.

3. The method of claim 1 or claim 2 wherein said heat source submerged within said melt is kept at a temperature just above the melting temperature of said single crystal.

4. The method of claim 1 or claim 2 wherein said heat sources are disc shaped.

5. The method of claim 1 or claim 2 wherein said heat slightly curved.

6. The method of claim 1 or claim 2 wherein the diameter of said heat source submerged within said melt is equal to that of the container.

7. The method of claim 1 wherein a selected atmosphere is provided in a tank containing said melt, said single crystal and said axial heat flow source.

8. The method of claim 1 or claim 2 wherein said axial heat flow source is protected from contact with said melt by an inert covering.

9. The method of claim 8 wherein said inert covering material is quartz, pyrolytic boron nitride, or graphite.

10. The method of claim 1 or claim 2 wherein said axial heat flow source is a resistance heater.

11. The method of claim 1 or claim 2 wherein said axial heat flow source produces a uniform radial temperature profile.

12. The method of claim 1 or claim 2 wherein said axial heat flow source further comprises a cylindrical plate heat diffuser.

13. The method of claim 12 wherein said heat diffuser is rotated.

14. The method of claim 1 further comprising providing a heat source surrounding said container to reduce radial heat losses.

15. The method of claim 14 wherein said heater is positioned at a level coincident with a crystal growth interface.

16. The method of claim 1 wherein said melt and said crystal are mechanically displaced with respect to said axial heat source by downward displacement of said container from said axial heat source.

17. The method of claim 1 wherein said melt and said crystal are mechanically displaced with respect to said axial heat source by upward displacement of said axial heat flow source from said single crystal.

18. The method of claim 1 or claim 2 wherein said heat source submerged in said melt is in close proximity to said crystal.

19. The method of claim 1 wherein said crystal is a III-V compound.

20. The method of claim 1 wherein said growing crystal is a II-VI compound.

21. The method of claim 19 wherein said III-V compound is selected from a group consisting of GaAs or InP.

22. The method of claim 1 or claim 2 wherein said heater submerged in said melt creates an annular passage between said heater and said container.

23. The method of claim 22 wherein said annular passage has dimensions comparable to said close proximity crystal.

24. A method for crystal growth by directional solidification comprising:

providing a melt having a chemical composition of a desired single crystal;

containing said melt in a crucible;

heating said melt axially with a first heater submerged in said melt and a second heater above said crucible, said second heater being in close proximity to said single crystal and having a diameter nearly equal to said crucible diameter;

providing a seed crystal to initiate growth of said single crystal;

removing heat with a heat-sink as said single crystal grows; and mechanically displacing said second heater with respect to said single crystal, within a tank which provides a controlled growth atmosphere.

25. The method of claim 24 wherein said heaters are disc shaped.

26. The method of claim 24 wherein said heaters are slightly curved.

27. The method of claim 24 wherein said heaters are protected from contact with said melt by an inert covering.

28. The method of claim 27 wherein said inert covering is quartz, pyrolytic boron nitride or graphite.

29. The method of claim 24 wherein said heaters are resistance heaters.

30. The method of claim 24 wherein said heaters produce a uniform radial temperature profile.

31. The method of claim 24 further including providing a heatsource surrounding said crucible to reduce radial heat losses.

32. The method of claim 31 wherein said heater is positioned at a level coincident with a crystal growth interface.

33. The method of claim 24 wherein said heaters further comprise cylindrical plate heat diffusers.

34. The method of claim 24 wherein said heat diffusers are related.

35. The method of claim 24 wherein said melt and said crystal are mechanically displaced with respect to said first heater by downward displacement of said crucible from said first heater.

36. The method of claim 24 wherein said melt and said crystal are mechanically displaced with respect to said first heater by upward displacement of said heater from said crystal.

37. The method of claim 24 wherein said first heater creates an annular passage between said heater and said crucible.

38. The method of claim 37 wherein said annular passage has dimensions comparable to said close proximity between said first heater and said crystal.

* * * * *

UNITED STATES PATENT AND TRADEMARK OFFICE
CERTIFICATE OF CORRECTION

PATENT NO.  : 5,047,113
DATED       : September 10, 1991
INVENTOR(S) : Aleksandar Ostrogorsky It is certified that error appears in the above-identified patent and that said Letters Patent is hereby corrected as shown below:

Column 4, line 67:  After "heat" insert --sources are--.

Column 5, line 3:   After "is" insert --nearly--.

Column 6, line 38:  Replace "related" with --rotated--.

Signed and Sealed this

Eighteenth Day of May, 1993

Attest:

MICHAEL K. KIRK

Attesting Officer

Acting Commissioner of Patents and Trademarks